(12) United States Patent
Park et al.

(10) Patent No.: US 11,978,650 B2
(45) Date of Patent: May 7, 2024

(54) APPARATUS FOR TRANSFERRING LED

(71) Applicant: LG DISPLAY CO., LTD, Seoul (KR)

(72) Inventors: Seong Kyong Park, Paju-si (KR); Tae Il Jung, Paju-si (KR); Il Soo Kim, Paju-si (KR); Jae Yong Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 413 days.

(21) Appl. No.: 17/428,241

(22) PCT Filed: Sep. 21, 2020

(86) PCT No.: PCT/KR2020/012681
§ 371 (c)(1),
(2) Date: Aug. 3, 2021

(87) PCT Pub. No.: WO2021/132849
PCT Pub. Date: Jul. 1, 2021

(65) Prior Publication Data
US 2022/0139748 A1 May 5, 2022

(30) Foreign Application Priority Data
Dec. 24, 2019 (KR) .......................... 10-2019-0173978

(51) Int. Cl.
*H01L 21/677* (2006.01)
*H01L 21/67* (2006.01)
*H01L 25/075* (2006.01)

(52) U.S. Cl.
CPC .. *H01L 21/67712* (2013.01); *H01L 21/67144* (2013.01); *H01L 21/67721* (2013.01); *H01L 21/67781* (2013.01); *H01L 25/075* (2013.01)

(58) Field of Classification Search
CPC ...... B65G 47/91; B65G 47/92; B65G 47/908; B65G 47/917; B25J 15/0616;
(Continued)

(56) References Cited

U.S. PATENT DOCUMENTS 10,615,064 B2 4/2020 Ahn et al.
10,707,105 B1 * 7/2020 Saketi ...................... H01L 33/62
(Continued)

FOREIGN PATENT DOCUMENTS

KR 10-2017-0113019 A 10/2017
KR 10-2019-0018385 A 2/2019
(Continued)

OTHER PUBLICATIONS

PCT International Search Report, PCT/KR2020/012681, dated Dec. 22, 2020, 3 Pages.

*Primary Examiner* — Glenn F Myers
(74) *Attorney, Agent, or Firm* — Fenwick & West LLP

(57) ABSTRACT

The present disclosure relates to an apparatus for transferring a light emitting diode (LED). The apparatus for transferring an LED includes: a pick-up unit configured to pick up at least some of multiple light emitting diodes (LEDs) arranged on one substrate, and, according to a received control signal, put down LEDs selected from among the picked-up LEDs on another substrate; and a controller configured to transmit the control signal to the pick-up unit so as to enable the pick-up unit to individually pick up or put down each of the multiple LEDs.

21 Claims, 9 Drawing Sheets

(58) Field of Classification Search
CPC ............... B25J 15/0608; B25J 15/0246; B25J 15/0085; H01L 21/6838; H01L 21/6833; H01L 21/67144; H01L 21/67766; H01L 21/67712; H01L 21/67742; H01L 21/67721; H01L 21/67781; H01L 25/075; H01L 25/0753; H01L 33/0095
USPC ............. 414/618, 752.1, 751.1, 749.1, 749.2
See application file for complete search history.

(56) References Cited

U.S. PATENT DOCUMENTS

| | | | |
|---|---|---|---|
| 2015/0298320 A1* | 10/2015 | Eisele | B25J 15/0066 294/24 |
| 2016/0029437 A1* | 1/2016 | Grohmann | B25J 15/06 219/486 |
| 2017/0263593 A1* | 9/2017 | Zou | H01L 33/0095 |
| 2019/0273177 A1* | 9/2019 | Hopkin | B81C 99/002 |
| 2019/0304817 A1 | 10/2019 | Ahn et al. | |
| 2021/0005643 A1* | 1/2021 | Chen | H01L 25/167 |

FOREIGN PATENT DOCUMENTS

| | | |
|---|---|---|
| KR | 10-2019-0074756 A | 6/2019 |
| KR | 10-2019-0106655 A | 9/2019 |

\* cited by examiner

APPARATUS FOR TRANSFERRING LED

TECHNICAL FIELD

The present application claims a priority of Korean Patent Application No. 10-2019-0173978 filed in the Republic of Korea on Dec. 24, 2019.

The present disclosure relates to a device of manufacturing a light emitting diode (LED), and more specifically, to an LED transport device.

BACKGROUND ART

Various display devices with a light-weight and flexible property has been developed. Among the display devices, a liquid crystal display device and an organic light emitting display device have been applied into common electronic devices, for example, a smartphone, a computer such as a notebook, and have been applied in other devices. Such display devices have a limit in reducing a size of a bezel area. For example, since sealant must be used to seal the liquid crystal and to coalesce the upper substrate and the lower substrate in the liquid crystal display device, there is a limit in reducing the size of the bezel area. In addition, since an organic light emitting element in an organic light emitting display device is made of an organic material, which is very vulnerable to moisture or oxygen, and therefore, an encapsulation for protecting the element, there is a limit in reducing the size of the bezel area. When a plurality of liquid crystal display devices or organic light emitting display devices are arranged in a tile form to implement a large display area, there is a problem that the bezel area between adjacent panels is easily recognized by the use.

As an alternative to those display devices, a display device using a small light emitting diode (LED) has been developed. Since the LED is made of an inorganic material rather than an organic material, it has excellent reliability and thus has longer lifespan compared to the liquid crystal display device or an organic light emitting display device. In addition, the LED is a device suitable for applications to very large display area because it not only has a fast lighting speed, but also can be driven with less consumption power, has excellent stability owing to high impact resistance, and can display high-brightness images. Above all, the display device using the small LED as a light emitting element can be implemented without the bezel, so it is advantageous to be applied to a very large display devices where a plurality of display devices are subsequently fabricated.

Since it is essential to secure productivity for the commercialization of such a small LED display device, various researches and studies for improving production rates and efficiency of the LED display device.

DISCLOSURE

Technical Problem

An object of the present disclosure is to provide a device capable of efficiently transporting a desired number of light emitting diodes.

Particularly, an object of the present disclosure is to provide a transport device capable of selectively transporting a desired number of light emitting diodes among a plurality of light emitting diodes.

The objects and the tasks of the present disclosure is not limited to the objects and tasks mentioned above, and other objects and tasks not disclosed herein will be clearly understood by those skill in the art form the following description.

Technical Solution

The present disclosure provides a light emitting diode transport device that comprises a pickup unit configured to lift at least a part of a plurality of light emitting diodes disposed on a substrate and to put down a selected light emitting diode of the lifted light emitting diodes on other substrate by a received control signal; and a controller configured to transmit the control signal to the pickup unit so that the pickup unit individually lifts or puts down each of the plurality of light emitting diodes.

The pickup unit may include a head including a plurality of detachable units configured to contact each of the plurality of light emitting diodes.

The head may include a plate connected to a transport arm configured to move the head, and a stamp, wherein one surface of the stamp may be configured to contact with the plate and other surface of the stamp may be configured to contact with the plurality of light emitting diodes, and wherein the detachable unit may be arranged protrudingly on the other surface of the stamp.

The stamp may comprise an elastomer.

As an example, each of the plurality of detachable unit may include a first electrode; a second electrode facing apart from the first electrode; a variable portion disposed between the first and second electrodes, the variable part having a dimension changeable by an electric signal applied through the first and second electrodes; and an adhesive portion detachably attached to at least one of the plurality of light emitting diodes.

The first electrode may include a plurality of strip electrodes and the variable portion may be arranged correspondingly to each of the plurality of strip electrodes.

For example, the variable portion may be configured to expand or contract by a pre-determined order.

Alternatively, the first electrode may include a plurality of strip electrodes having a concentric circle or a ring shape, and wherein the plurality strip electrodes may be separated from each other, respectively.

In this case, the detachable unit may include a conductive wire connected to each of the plurality of strip electrodes.

Alternatively, the first electrode may include a plurality of strip electrodes extended along a first direction and the second electrode may include a plurality of stripe electrodes extended along a second direction intersecting the first direction.

In this case, the variable portion may be located at a position where any one of the plurality of strip electrodes extending along the first direction crosses any one of the plurality of strip electrodes extending along the second direction.

Alternatively, the first electrode may include a plurality of strip electrodes having a concentric circle or a ring shape, and wherein each of the plurality of strip electrodes is connected electrically to each other.

In this case, each of the plurality of strip electrodes may have a different thickness from each other.

For example, a central strip electrode among the plurality of strip electrodes may be the thickest.

The plurality of strip electrodes may be tapered from a center to a periphery.

Alternatively, a variable portion disposed correspondingly to the central strip electrode may expand or contract before a variable portion corresponding to other strip electrode expands or contracts.

The variable portion may comprise an electrically active polymer.

For example, the variable portion may comprise a polymer selected from the group consisting of polyvinylidene fluoride, poly(vinylidene fluoride-co-trifluroethylene), polydimethyl siloxane, an electrically active polymer, a liquid crystal elastomer and copolymer thereof.

The adhesive portion may comprise a polymer selected from the group consisting of polydimethyl siloxane, a polyamide acid and combination thereof.

Each of the plurality of detachable units may have a different height from each other.

Advantageous Effects

The light emitting diode (LED) transport device of the present disclosure can select a desired part and/or a desired quantity of LEDs among a plurality of LEDs and transfer and/or transport them.

The LED transport device of the present disclosure can mount the LED at a predetermined position accurately, which can lead to an increase in productivity of the LED display device. Technical effects of the present disclosure are not limited to the effects exemplified above, and more various effects are included in the present specification.

MODE FOR INVENTION

Figure 1:
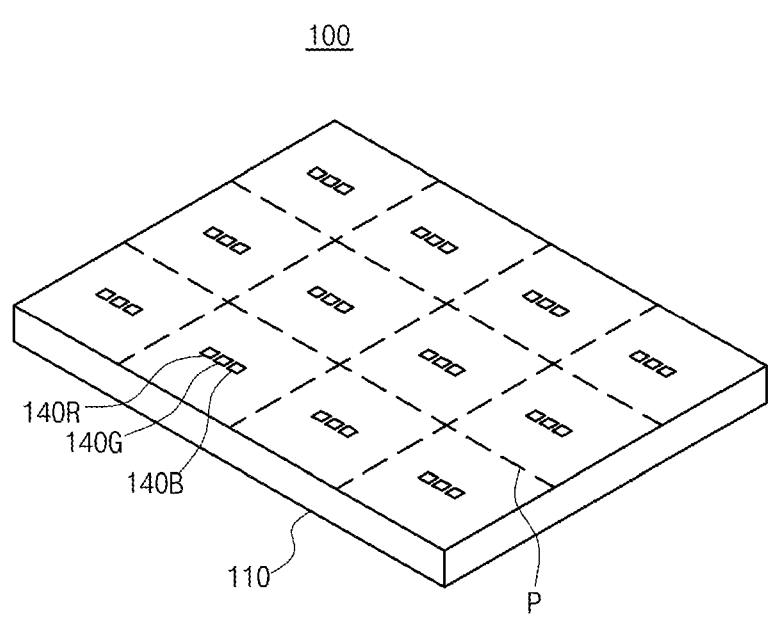
FIG. 1 is a schematic perspective view illustrating an LED display device in accordance with an exemplary embodiment of the present disclosure.

Advantages and features of the present disclosure and methods of achieving them will become apparent from the following embodiments in detail in conjunction with the accompanying drawings. However, the present disclosure is not limited to the embodiments described below, but will be implemented in various forms. It will be understood that the following embodiments are provided only to complete the present disclosure and to fully inform those of ordinary skill in the art to which the present disclosure belongs to, and that the scope of the present disclosure is defined by the appended claims.

The shapes, proportions, angles, numbers, and the like illustrated in the drawings for describing the exemplary embodiments of the present disclosure are exemplary, and thus the present disclosure is not limited to the illustrated contents. Like reference numerals refer to like element throughout herein. In addition, in describing the present disclosure, if it is determined that a detailed description of a related know technology may unnecessarily obscure the subject matter of the present disclosure, the detailed description thereof will be omitted. When "including", "having", "comprising", and the like mentioned herein, other parts or elements may be added unless 'only' is used. When an element is expressed in the singular, the plural elements are included unless otherwise explicitly stated. In interpreting the elements, it should be interpreted as including an error range even if there is no explicit description.

In case of a description of the positional relationship, for example, when the positional relationship of two parts or elements such as "on", "over", 'under', 'beneath", "beside" is described, one or more parts or elements may be disposed between two parts or element unless "straightly" or "directly" is used. When a device or a layer is referred to as "on" the other device or layer, the device or the layer is located directly on the other device or layer, or any intervening device or layer interposed therebetween. When it is described that an element is "connected", "coupled", or "bound" to the other element, it should be understood that the element may be directly connected to or bound to the other element, but other element may be intervened between each element, or each element may be 'connected", "coupled" or "bound" through other element.

While first, second, and the like are used to describe various elements, those elements are not limited by those terms. Those terms are only used to distinguish one element from another. Accordingly, the first element described below may be the second element within the spirit of the present disclosure. The size and thickness of each element shown in the drawings are illustrated for convenience of description, and the present disclosure is not limited to the size and the thickness of the illustrated elements. Hereinafter, various exemplary embodiments of the present disclosure will be described in detein with reference to the accompanying drawings.

FIG. 1 is a schematic perspective view illustrating a light emitting diode (LED) display device in accordance with an exemplary embodiment of the present disclosure. As illustrated in FIG. 1, the LED display device 100 includes a plural pixel P arranged on a substrate 110. The pixel P may include a red sub-pixel 140R, a green sub-pixel 140G and a blue sub-pixel 140B.

A thin film transistor TFT (FIG. 2) as a driving element and LED 140 (FIG. 2) as luminescent element may be located in each of the sub-pixels 140R, 140G and 140B. The LED 140 and the thin film transistor TFT may be connected to a driving part such as a gate control circuit, a data control circuit, and the like through a line such as a gate line, a data line and the like. When a chip size (width) of the LED 140 is 100 um or less, it is also called a micro LED display device. On the other hand, if the chip size of the LED 140 is about several hundred micrometers, it is also called a mini LED display device.

The LED 140 may be manufactured separated from the array process of the substrate 100. While the thin film transistor TFT and a light emitting element are fabricated by a photo process in an organic light emitting display device, the thin film transistor TFT is fabricated by a photo process, but the LED 140 may be fabricated in a separate process and then transferred on the substrate 100 in the LED display device. As an example, the LED 140 may be fabricated by growing an inorganic material such as Al, Ga, N, P, As, In and the like on a growth substrate (e.g. a sapphire substrate or a silicon substrate) and then spearing the grown inorganic material from the growth substrate.

Figure 2:
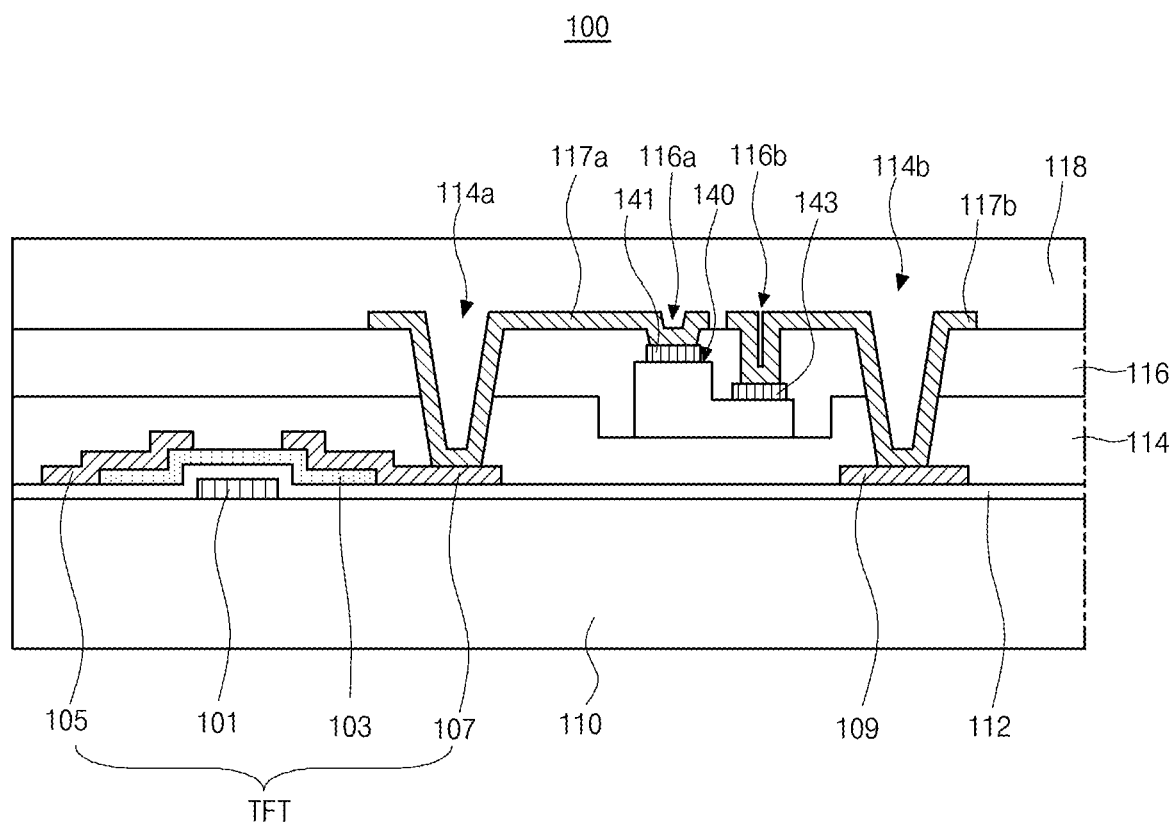
FIG. 2 is a schematic cross-sectional view illustrating a display area of an LED display device in accordance with an exemplary embodiment of the present disclosure.

FIG. 2 is a schematic cross-sectional view illustrating a display area of an LED display device in accordance with an exemplary embodiment of the present disclosure. As illustrated in FIG. 2, an active area of displaying an image and an inactive area surrounding the active area may be defined in the LED display device 100. A luminescent element (e.g. LED 140) and a driving element (e.g. thin film transistor TFT) for driving the luminescent element may be arranged in the active area. The inactive area is an area in which no image is displayed, various lines and control circuits connected to the elements disposed in the active area may be arranged in the inactive area. With referring to FIG. 2, various functional components are laminated on a substrate 110 in the LED display device 100 in accordance with an exemplary embodiment of the present disclosure. For example, the substrate 100 may comprise glass, a resin, a polymer or a plastic. In some embodiments, the substrate 110 may be made of materials having flexibility or foldability.

The thin film transistor TFT may comprise a gate electrode 101 disposed on the substrate 110, a gate insulating layer 112 covering the gate electrode 112, a semiconductor layer 103 disposed on the gate insulating layer 112, a source electrode 105 and a drain electrode 107 each of which is disposed on the semiconductor layer 103.

The gate electrode 101 may be made of Cr, Ta, Cu, Ti, Al or alloy thereof and the gate insulating layer 112 may have a mono-layered structure or a multiple-layered structure each of the gate insulating layer 112 may comprise inorganic insulating material such as $SiO_x$ or $SiN_x$.

The semiconductor layer 103 may comprise amorphous semiconductor such as amorphous silicon or oxide semiconductor such as IGZO (Indium Gallium Zinc oxide), $TiO_2$, ZnO, $WO_3$ and $SnO_2$. The semiconductor layer 103 of the thin film transistor TFT is not limited to the above particular materials, and the semiconductor layer 103 may comprise all kinds of semiconductor materials utilized in the current thin film transistor.

The source electrode 105 and the drain electrode 107 may be made of metal such as Cr, Mo, Ta, Cu, Ti, Al, and the like or alloy thereof. The drain electrode 107 acts as a first electrode applying a signal to the LED 140.

While the thin film transistor TFT illustrated in FIG. 2 is a bottom-gate type thin film transistor, other type thin film transistor such as top-gate type thin film transistor may be applied into the LED display device 100 of the present disclosure.

A second electrode 109 is disposed on the gate insulating layer within the active area. The second electrode 109 may be made of Cr, Mo, Cu, Ti, Al or alloy thereof and may be fabricated by the same process of the drain electrode 107 of the thin film transistor TFT.

A first insulating layer 114 is disposed on the source electrode 105, the drain electrode 107 and the second electrode 109, and the LED 140 is arranged on the first insulating layer 114. While a part of the first insulating layer 114 is removed and the LED 140 is arranged in the removed area in an aspect of FIG. 2, the first insulating layer 114 may not be removed. The first insulating layer 114 may be an organic layer including photo-acryl or an inorganic insulating material such as $SiO_x$ or $SiN_x$. Alternatively, the first insulating layer 114 may have a double-layered structure of an inorganic layer/organic layer or a triple-layered structure of an inorganic layer/an organic layer/in organic layer.

A second insulating layer 116 is disposed on the first insulating layer 114. The second insulating layer 116 may be an organic layer of photo-acryl or an inorganic layer of $SiO_x$ or $SiN_x$. Alternatively, the second insulating layer 116 may have a double-layered structure of an inorganic layer/organic layer or a triple-layered structure of an inorganic layer/an organic layer/in organic layer, and covers an upper area of the LED 140.

A first contact hole 114a and a second contact hole 114b are formed in the first insulating layer 114 and the second insulating layer 116 over the thin film transistor TFT and the second electrode 109. Each of the drain electrode 107 of the thin film transistor TFT and the second electrode 109 is exposed externally through the first and second contact holes 114a and 114b, respectively. In addition, a third contact hole 116a and a fourth contact hole 116b are formed on a p-type electrode 141 of the LED 140 and the second insulating layer 116 over a n-type electrode 143 of the LED, respectively. Each of the p-type electrode 141 and the n-type electrode 143 is exposed externally through the third and fourth contact holes 116a and 116b, respectively.

A first connect electrode 117a and a second connect electrode 117b, each of which is made of a transparent metal oxide such as ITO, IGZO and ITO, are disposed on the second insulating layer 116. The drain electrode 107 of the thin film transistor TFT and the p-type electrode 141 of the LED 140 are electrically connected to the first connect electrode 117a through the first and third contact holes 114a and 116a, respectively. In addition, the second electrode 109 and the n-type electrode 143 are electrically connected to the second connect electrode 117b through the second and fourth contact holes 114b and 116b, respectively.

A buffer layer 118 made of inorganic material and/or organic material may be disposed over the substrate 110 to cover and protect the LED 140.

Figure 3:
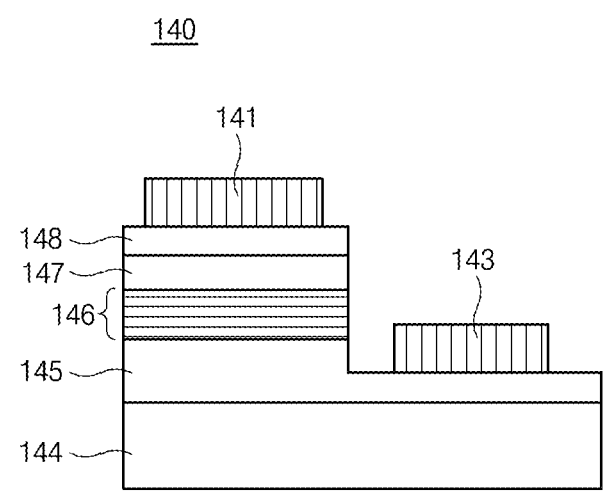
FIG. 3 is a schematic cross-sectional view illustrating an LED in accordance with an exemplary embodiment of the present disclosure.

FIG. 3 is a schematic cross-sectional view illustrating an LED in accordance with an exemplary embodiment of the present disclosure. As an example, the LED 140 may be a micro LED having a size of 10 um to 100 nm. The LED 140 may include a non-doped GaN layer 144, a n-type GaN layer 145 disposed on the non-doped GaN layer 144, an active layer 146 disposed on the n-type GaN layer 145 and having a Multi-Quantum-Well (MQW) structure, a p-type GaN layer 147 disposed over the active layer 146, an ohmic contact layer 148 made of transparent conductive material and disposed on the p-type GaN layer 148, a p-type electrode 141 contacting a part of the ohmic contact layer 148 and a n-type electrode 143 which is in contact with a part of the n-type GaN layer 145 exposed by etching a part of the active layer 146, the p-type GaN layer 147 and the ohmic contact layer 148.

The n-type GaN layer 145 is a layer proving electrons to the active layer 146 and may be formed by doping a GaN semiconductor layer with n-type impurity such as Si.

The active layer 146 is a layer where injected electrons and holes are recombined to emit light. The MQW structure in the active layer 146 has multiple barrier layers and well layers alternately. As an example, the well layer may be an InGaN layer and the barrier layer may be a GaN layer, but is not limited thereto.

The p-type GaN layer 147 is a layer proving holes to the active layer 146 and may be formed by doping a GaN semiconductor layer with p-type impurity such as Mg, Zn and Be.

The ohmic contact layer 148 allows the p-type GaN layer 147 and the p-type electrode 141 to ohmic contact and may comprise, but is not limited to, a transparent metal oxide such as ITO (indium tin oxide), IGZO (indium gallium zinc oxide) and IZO (indium zinc oxide).

Each of the p-type electrode 141 and the n-type electrode 143 may have a single-layered structure or a multiple-layered structure each of which is made of at least one metal of Ni, Au, Pt, Ti, Al, Cr or alloy thereof.

As electrical voltages are applied into the p-type electrode 141 and the n-type electrode 143 in the LED 140 having the above-mentioned structure, and therefore holes and electrons are injected into the active layer 145 from the n-type GaN layer 145 and the p-type GaN layer 147, excitons are generated in the active layer 146. As the generated excitons are decayed in the active layer 146, a light corresponding to an energy gap between a LUMO (lowest unoccupied molecular orbital) energy level and a HOMO (highest occupied molecular orbital) energy level is generated to emit externally. The wavelength of the light emitted from the LED 140 may be regulated by adjusting the thickness of the barrier layer in the MQW structure of the active layer 145.

The LED 140 may be fabricated by forming a buffer layer on a growth substrate and growing a GaN thin film on the buffer layer. The substrate for growth the GaN thin film may include, but is not limited to, sapphire, silicon (Si), GaN, silicon carbide (SiC), GaAs, ZnO and the like.

The buffer layer prevents quality deterioration by lattice mismatch which is caused in the course of growing directly the n-type GaN layer 145 of Epi layer on the growth substrate when the substrate for growing GaN thin film is made of material other than GaN, and the buffer layer may include MN or GaN.

The n-type GaN layer 145 may be fabricated by growing the non-doped GaN layer 144 and then by doping the n-type impurity such as Si on the non-doped GaN layer 144. Similarly, the p-type GaN layer 147 may be fabricated b growing a non-doped GaN layer and then by doping the p-type impurity such as Mg, Zn, Be, and the like.

As illustrated in FIGS. 1 and 2, the LED 140 is transferred to the display substrate 110 to be utilized in the LED display device 100.

In this case, the process of transporting the LED 140 from the growth substrate or production substrate to the display device is called transfer.

Currently, two or more LEDs are often arranged in one sub-pixel 140R, 140G or 140B (FIG. 1) in preparation for the failure of the LED generated in the manufacturing and/or transferring process. However, as the number of sub-pixel is increasing in a display device that has been evolving to high resolution, the number of LEDs to be transferred becomes too large taking the preliminary LEDs into account. This is a huge loss in terms pf production time and cost. Moreover, when all the LEDs arranged in two or more are defective, the sub-pixels 140R, 140G and 140G cannot be repaired, so there is a problem that product quality is deteriorated. In addition, it is a current technology to transfer the entire LED on one substrate to another substrate, and thus, it is impossible to transfer only a selected part of the LEDs on one substrate. Accordingly, even if there is an LED having a defect found in the inspection, it is difficult to separate or exclude the defected LEDs in the transfer process.

The inventors recognized the disadvantages in the current LED transport process and devices and devised a transport device capable of giving the transfer or transports electivity of the LEDs and increasing the mounting precision.

Figure 4:
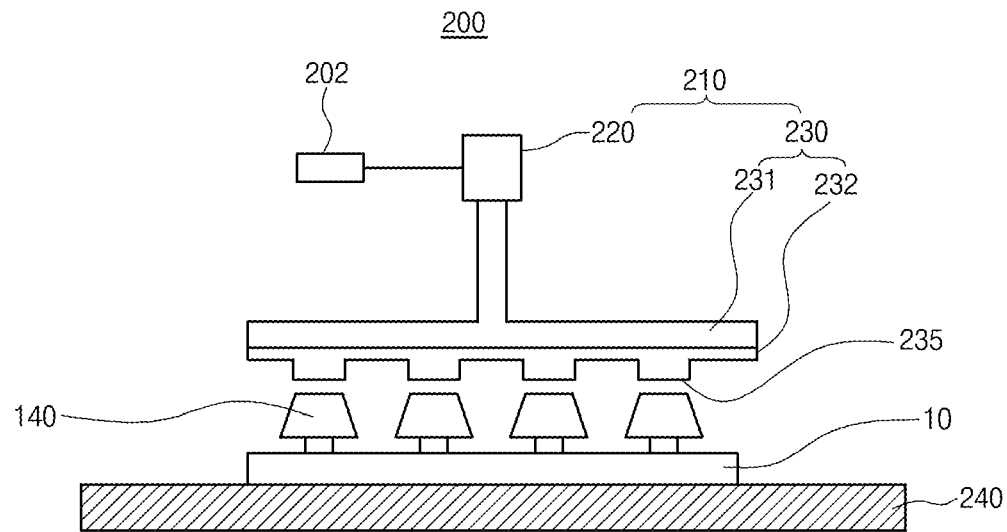
FIG. 4 is a schematic diagram illustrating an LED transport device in accordance with an exemplary embodiment of the present disclosure.
Figure 5:
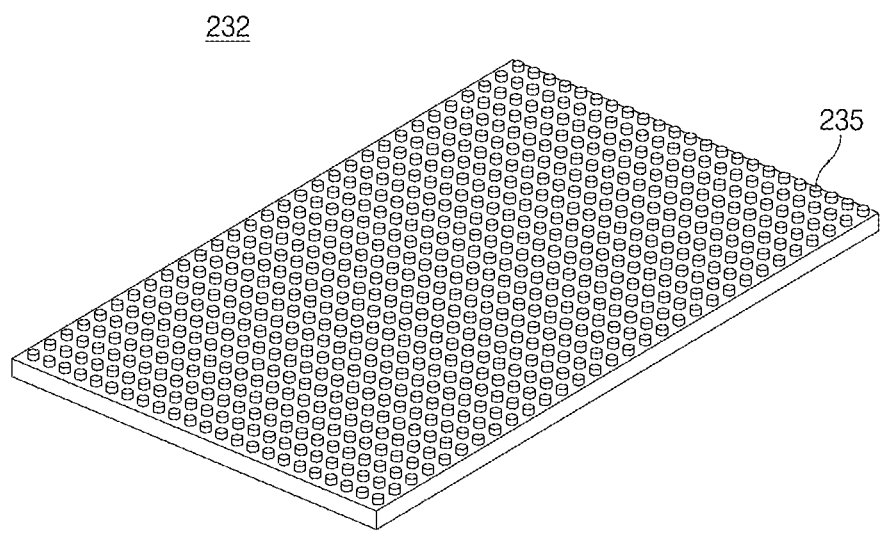
FIG. 5 is a schematic perspective view illustrating the structure of stamp with a detachable unit that constitutes an LED transport device in accordance with an exemplary embodiment of the present disclosure.
Figure 6:
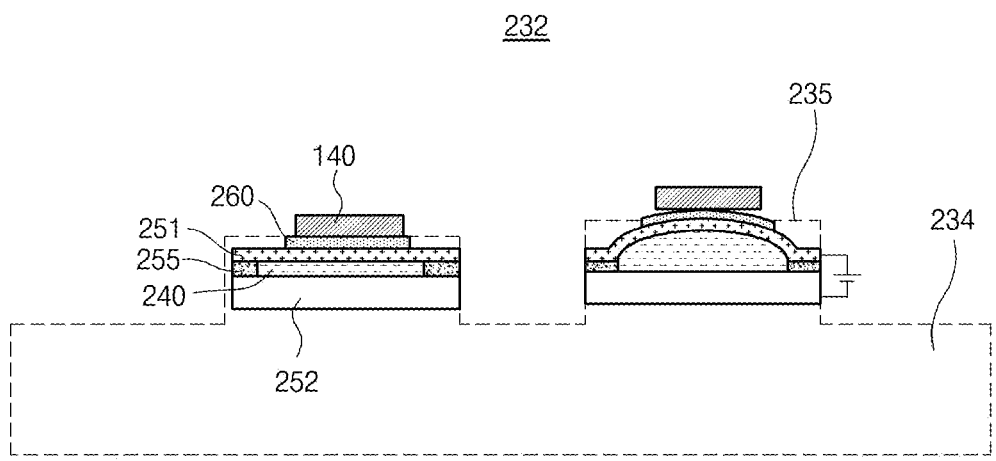
FIG. 6 is a schematic cross-sectional view illustrating the structure of a stamp with a detachable unit that constitutes of an LED transport device in accordance with an exemplary embodiment of the present disclosure.

FIG. 4 is a schematic diagram illustrating an LED transport device in accordance with an exemplary embodiment of the present disclosure, FIG. 5 is a schematic perspective view illustrating the structure of stamp with a detachable unit that constitutes an LED transport device in accordance with an exemplary embodiment of the present disclosure, and FIG. 6 is a schematic cross-sectional view illustrating the structure of a stamp with a detachable unit that constitutes of an LED transport device in accordance with an exemplary embodiment of the present disclosure.

The LED transport device in accordance with an exemplary embodiment of the present disclosure may comprise multiple functional units. Hereinafter, an LED transport device will be described with a focus on a pickup unit 210 that lifts the LED 140 from one substrate (e.g. growth substrate) and lowers the LED 140 on another substrate (e.g. display substrate). The LED 140 may me a micro LED having a chip size (width) of 100 micrometer (um) or less.

The LED transport device 200 may comprise a controller 220 to control multiple functions units including the pickup unit 210. The substrate 10 shown in FIG. 4 is one substrate before completing the LED transportation, and may be a growth substrate where the LED 140 is generated, or a transport substrate before the LED 140 is finally mounted and transferred in the LED display device 100 (FIGS. 1 and 2).

The pickup unit 210 is configured to transfer and transport selectively the LED 140. Particularly, the pickup unit 210 is configured to lift at least some of the plurality of LEDs 140 arranged on one substrate 10 and to lower the selected LED 140 among the lifted LEDS 140 onto other substrate by control signal received from the controller 202. To this end, the pickup unit 210 is configured to independently lift and/or lower each LED 140. For example, the pickup unit 210 may have a plurality of detachable units 235 that are configured to contact with, lift and lower each of the plurality of LEDs 140.

As an exemplary embodiment, the pickup unit 210 may include a head 230 provided with the plurality of detachable units 235 and a transportation arm 220 configured to move the head 230. Meanwhile, the controller 202 controls the LED 140 to be attached to or detached from the detachable unit 230 by transmitting control signal. In addition, the LED transport device 200 may further comprise a support 240 configured to seat the one substrate 10 or the other substrate thereon. In another exemplary embodiment, the support 240 may be configured separately from the LED transport device 200.

The head 230 may comprise a plate 231 connected to the transport arm 220, a stamp 232 under the plate 231. One surface of the stamp 232 is bonded to the plate 231, and the other surface of the stamp 232 configured to contact with the LEDs 140 includes the detachable units 235. In the drawing, the plate 231 and the stamps 232 are separately illustrated, but two elements may be integrally formed. That is, the stamp having the detachable units 235 on one side may be connected directly to the transport arm 220.

FIGS. 5 and 6 illustrate an example of the stamp 232. The stamp 232 may be made of an elastomer with a predetermined elastic property so as not to apply an impact upon contact with the LED 140. For example, the stamp 240 may be made of, but is not limited to, rubber or polymeric organosilicon such as PDMS (polydimethyl siloxane). For example, the stamp 232 may include a body 234 and the detachable unit 235, as illustrated in FIG. 6, and the detachable unit 235 may have a protrusion shape protruding from one surface of the body 234.

The stamp 232 may have one or more detachable units 235 on one surface. The detachable unit 235 may have a cylindrical shape, a conical column shape or a polygonal column shape, and one or more of the detachable unit 235 may correspond to the upper surface of the LED 140. The detachable unit 235 may be configured to be detachably attached to the LED 140 depending on whether the interior structure is expanded or not.

The transport arm 220 is connected to the head 230 and moves the head 230 three-dimensionally under the control of the controller 202. The controller 202 transmits control signal to the pickup unit 210 so that the pickup unit 210 lifts or lowers each of the plurality of LEDs 140 individually. For example, the controller 202 may control whether to lift and/or lower the corresponding LED 140 by transmitting a predetermined signal (e.g. voltage, current) to the specific detachable units 235. The controller 202 may determine how to hold or release the specific LED 140 and may transmit a corresponding signal to the detachable units 235.

FIG. 6 illustrates a detailed structure of the detachable unit 235. The detachable unit 235 may include a first electrode 251, a second electrode 252 facing apart from the first electrode 251; a variable portion 240 disposed between the first and second electrodes 251 and 252 and having a dimension, for example, a volume, changeable by an electrical signal applied through the first and second electrodes 251 and 252; an adhesive portion 260 configured to detachably attached to at least one of the plurality of LEDs 140. The first electrode 251 and/or the second electrode 252 may be made of material having a variable shape.

A control signal is transmitted to each of the first electrode 251 and the second electrode 252. In the drawing, an electrical signal is transmitted to the first electrode 251 and the second electrode 252. The dimension of the variable portion 240 may be adjusted by the control signal applied to the first electrode 251 and the second electrode 252. The variable portion 240 may be made of an electroactive polymer, and in this case, when a constant voltage/current is applied, the molecular arrangement of the electroactive polymer is changed and expanded and/or contracted to change its dimension. The degree of expansion and/or contraction of the electroactive polymer varies depending upon the strength of the applied voltage/current, and therefore, the overall height of the detachable unit 235 may be changed. The shape of the first electrode 251 and/or second electrode 252 may change depending upon the expansion and/or contraction of the variable portion 240.

When there are a plurality of detachable units 235, each of the detachable units 235 may have a different height from each other by varying the electrical signal applied to each detachable unit 235 and thereby, changing the variable dimension of the variable portion 240. Accordingly, when the LED 140 is lifted, the detachable unit 235 having the variable portion 240 expanded to a greater extent comes into contact with the LED 140 to lift the LED 140 form the one substrate 10. In addition, when the LED 140 is put down, the LED 140 attached to the detachable unit 235 having the variable portion 240 expanded to a greater extent comes into contact with the target substrate so that only the corresponding LED 140 is mounted on the target substrate. In this case, the height change of the detachable unit 235 may be greater than the height of the corresponding LED 140.

The variable portion 240 a polymer having an electrostrictive property such as PVDF (polyvinylidene fluoride) and/or p(VDF-TrFE) (poly(vinylidene fluoride-trifluoroethylene); a polymer having a dielectric property such as PDMS (polydimethyl siloxane); and copolymer thereof. Alternatively, the variable portion 240 may be made of a polymer including an electroactive polymer including a liquid crystal molecule, a rubber molecule and a mesogen molecule; a liquid crystal elastomer and copolymer thereof.

The adhesive portion 260 is made of a material having adhesiveness and is in direct contact with the LED 140. The adhesive portion 260 is required to have a degree of adhesion while holding the LED 140 while being transferred from one substrate 10 to another substrate. In addition, since the adhesive force of the adhesive portion 260 is smaller than the adhesive force applied to the point where the LED 140 is mounted among the target substrate, the LED 140 placed on the target substrate may be remained there. The adhesive portion 260 may be made from a patternable photo-sensitive adhesive composition, for example, PDMS (polydimethyl siloxane)-based, polyimide resin precursor (polyamide acid)-based or polyimide resin-based material.

FIG. 6 illustrates that the each of first electrode 251, the second electrode 252 and the variable portion 240 in the detachable unit 235 has a single shape. Alternatively, as will be described below, the first electrode 251 and/or the second electrode 252 includes two or more stripe electrodes, and the variable portion 240 is disposed to correspond to each of the strip electrodes. In addition, the variable portion 240 disposed to correspond to each of the strip electrodes may be configured to sequentially expand or contract by a predetermined order.

In such a structure of the strip electrode and the variable portion 240, the dimension of the variable portion 240 can be variably changed even in a single detachable unit 235. Accordingly, the detachable unit 235 may perform an operation of lifting or lowering the LED 140 more precisely. Some examples and operations of the detachable unit 235 including a plurality of strip electrodes and the variable portion 240 will be described below.

Figure 7:
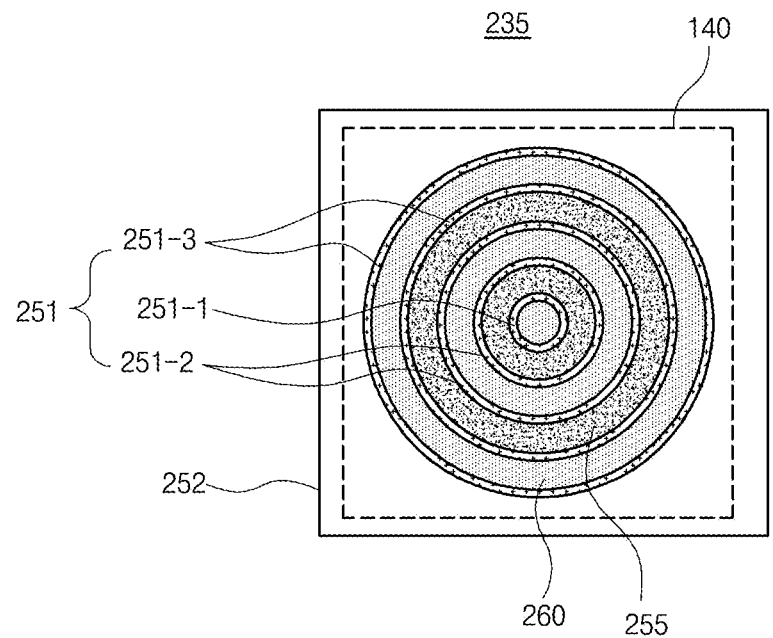
FIG. 7 is a schematic plan view illustrating the structure of a detachable unit in accordance with an exemplary embodiment of the present disclosure.
Figure 8:
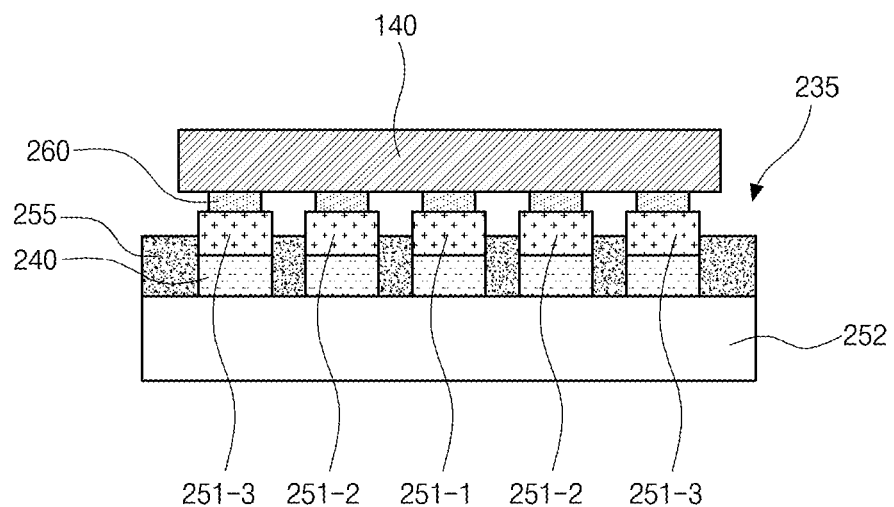
FIGS. 8 to 10 are schematic cross-sectional views illustrating a process in which LED is attached through a detachable unit in accordance with an exemplary embodiment of the present disclosure.
Figure 9:
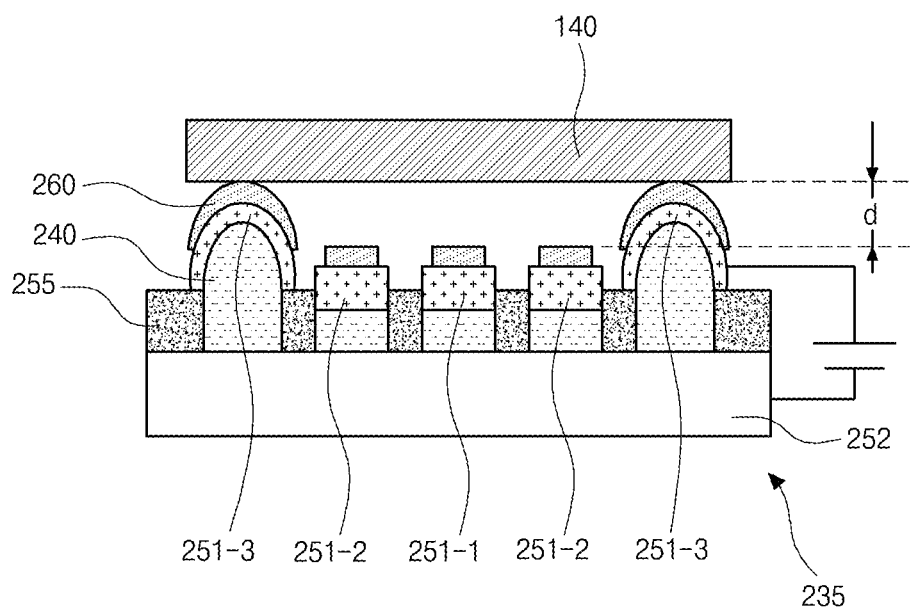
Figure 10:
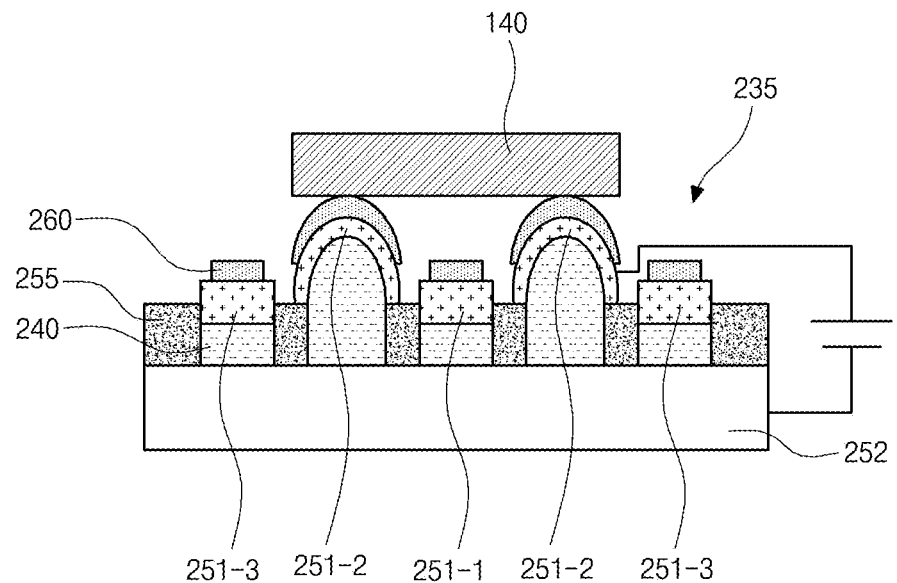

FIG. 7 is a schematic plan view illustrating the structure of a detachable unit in accordance with an exemplary embodiment of the present disclosure. FIGS. 8 to 10 are schematic cross-sectional views illustrating a process in which LED is attached through a detachable unit in accordance with an exemplary embodiment of the present disclosure.

The detachable unit 235 in accordance with one exemplary embodiment of the present disclosure comprises a first electrode 251 and a variable portion 240 each of which includes multiple fragments of circular shape and/or a ring shape. In an exemplary embodiment illustrated in FIGS. 7 to 10, the first electrode 251 includes a plurality of strip electrodes 251-1, 251-2 and 251-3 having a concentric circle or a ring shape, and each of the strip electrodes 251-1, 251-2 and 251-3 is separated from each other. A first strip electrode 251-1 having a circular shape is located at the center, and second and third strip electrodes 251-2 and 251-3 having a ring shape of having a larger diameter are disposed outside of the first strip electrode 251-1. The adhesive portion 260 may be applied to one surface of each strip electrode (or a surface in contact with each strip electrode). The second electrode 252 has a single, non-separated shape.

An insulating layer 255 is provide between each of the strip electrodes 251-1, 251-2 and 251-3 constituting the first electrode 251. Each of the detachable units 235 may include a conductive wire connected to each of the strip electrodes 251-1, 251-2 and 251-3 so that a separate control signal can be transmit to each of the strip electrodes 251-1, 251-2 and 251-3.

As an example, when the LED 140 is lifted and then placed on the target substrate, an electric signal is applied only to the third strip electrode 251-3 disposed at the outmost portions among the strip electrodes, as shown in FIG. 9, so that only the variable portion 240 corresponding to the third strip electrode 251-3 can be enlarged. Alternatively, as shown in FIG. 10, an electric signal can be applied to only the inner annular second strip electrode 251-2, and thereby, only the variable portion 240 corresponding to the second strip electrode 251-2 can be enlarged.

Accordingly, a height difference "d" may occur between the expanded portion of the variable portion 240 and the non-expanded portion of the variable portion 240. As such, when only a part of the variable portion 240 becomes large, only the detachable unit 235 of the corresponding portion contacts the LED 140 and the detachable unit 235 of the other portion is separated from the LED 140. Accordingly, since the overall adhesive force between the detachable unit 235 and the LED 140 is weakened, the LED 140 can be more easily mounted on the target substrate.

As another exemplary embodiment, a control signal (expansion signal) is sequentially transmitted from the center circular first strip electrode 251-1 to the outer ring type second and third strip electrodes 251-2 and 251-3 gradually, so as to expand the variable portion 240. When the LED is put down in this way, in the order of the LED 140 corresponding to the peripheral detachable unit 235 from the LED 140 corresponding to the central detachable unit 235, the LED 140 is attached to the target substrate, so that the LED 140 can be accurately attached to the target point without distortion.

Figure 11:
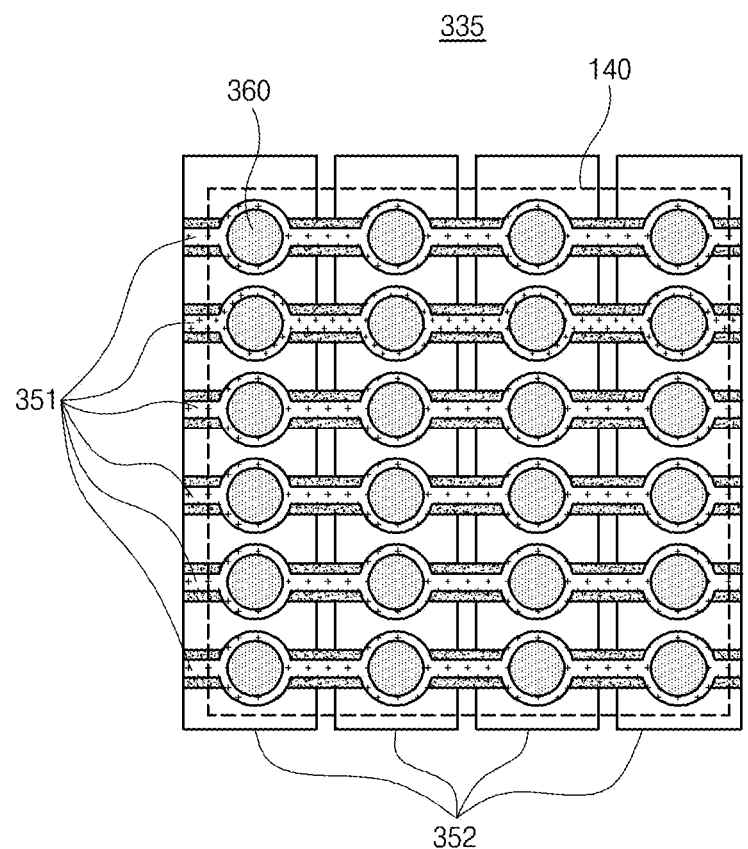
FIG. 11 is a schematic plan view illustrating the structure of a detachable unit in accordance with another exemplary embodiment of the present disclosure.
Figure 12:
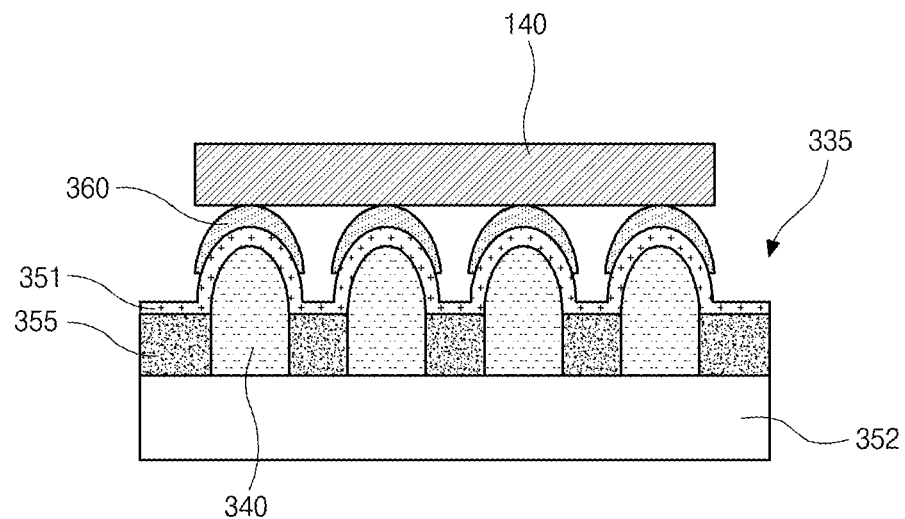
FIG. 12 is a schematic plan view illustrating the structure of a detachable unit in accordance with still another exemplary embodiment of the present disclosure.

FIG. 11 is a schematic plan view illustrating the structure of a detachable unit in accordance with another exemplary embodiment of the present disclosure. FIG. 12 is a schematic plan view illustrating the structure of a detachable unit in accordance with still another exemplary embodiment of the present disclosure. The detachable unit 335 in accordance with this exemplary embodiment includes a first electrode 351, a second electrode 352 and a variable portion 340 each of which comprises several pieces. In the examples in FIGS. 11 and 12, the first electrode 351 includes a plurality of stripe electrodes extending along a first direction. Referring to FIG. 11, the first electrode 351 includes six stripe electrodes, but the present disclosure is not limited thereto. Some of the plurality of strip electrodes constituting the first electrode 351 may have the same shapes as the variable portion 340. For example, some of the plurality of the strip electrodes constituting the first electrode 350 is formed in the same shape as the variable portion 340, and four circular parts are provided in one strip electrode, but is not limited thereto.

In addition, the second electrode 352 includes a plurality of stripe electrodes extending along and arranged in a second direction intersecting the first direction. With referring to FIG. 11, the second electrode 352 includes four strip electrodes extending along a vertical direction, but the present disclosure is not limited thereto. An insulating layer 355 may be disposed between the strip electrodes of the first electrode 351 and between the strip electrodes of the second electrode 352. Reference numeral 360 indicates an adhesive portion.

The variable portion 340 may be positioned at a point where any one of the plurality of the strip electrodes constituting the first electrode 351 extending in the first direction intersects with any one of the plurality of the strip electrodes constituting the second electrode 352 extending in the second direction. Referring to FIGS. 11 and 12, a small circular variable portion 340 may be provided at each meeting point between one of the strip electrodes constituting the first electrode 350 and one of the strip electrodes constituting the second electrode 352. As such, if the variable portion 340 has a so-called dot arrangement, the controller (not shown) may select only the specific variable portion 340 by the size or shape of the LED 140 to expand and/or contract the selected variable portion 340. Therefore, the detachable unit 350 can handle the LED 140 of various sizes and shapes.

Figure 13:
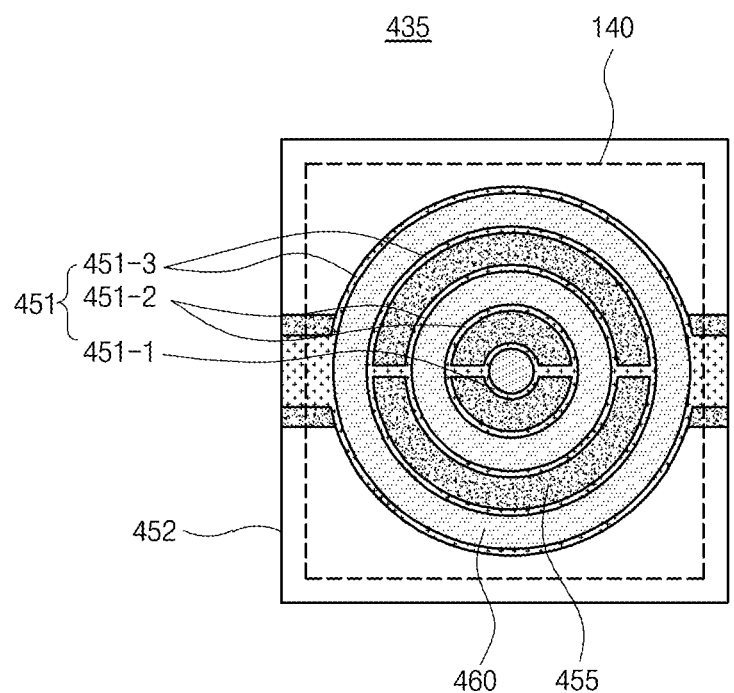
FIG. 13 is a schematic plan view illustrating the structure of a detachable unit in accordance with still another exemplary embodiment of the present disclosure.
Figure 14:
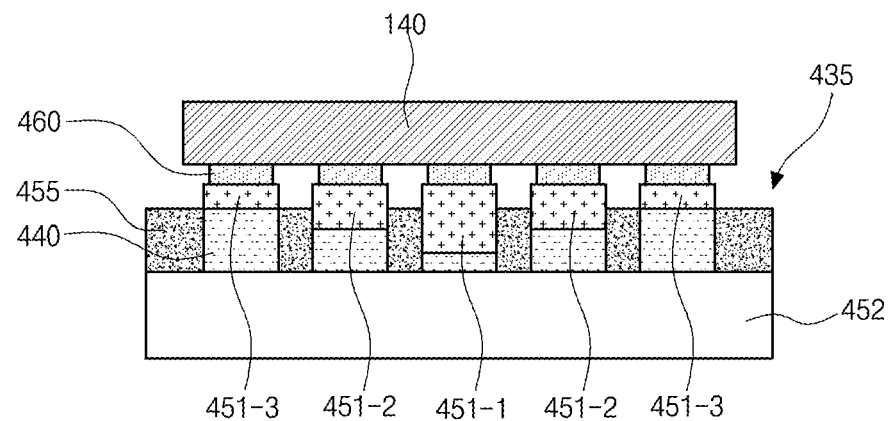
FIGS. 14 to 17 are schematic cross-sectional views illustrating a process in which LED is attached through a detachable unit in accordance with an exemplary embodiment of the present disclosure.
Figure 15:
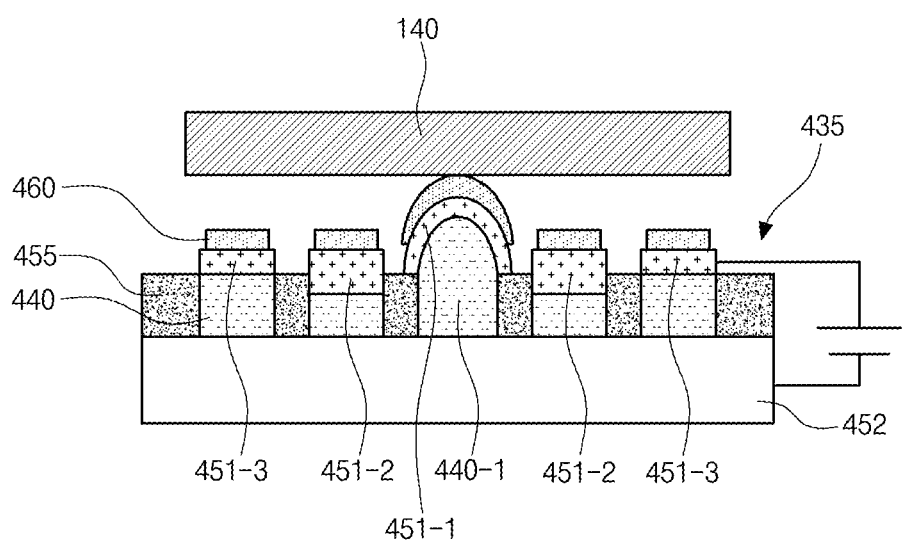
Figure 16:
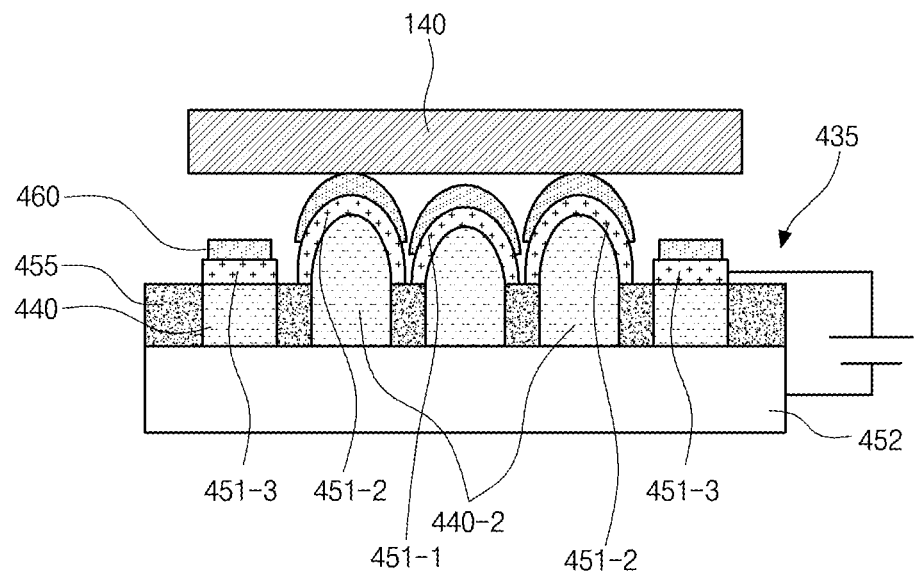
Figure 17:
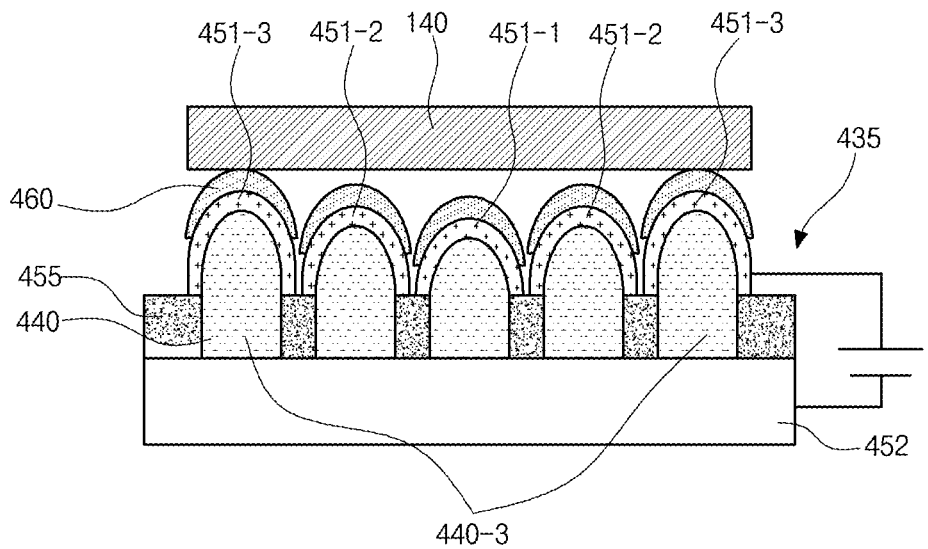

FIG. 13 is a schematic plan view illustrating the structure of a detachable unit in accordance with still another exemplary embodiment of the present disclosure. FIGS. 14 to 17 are schematic cross-sectional views illustrating a process in which LED is attached through a detachable unit in accordance with an exemplary embodiment of the present disclosure. The detachable unit 435 in accordance with the third embodiment of the present disclosure includes the first electrode 451 and the variable portion 440 each of which includes a plurality of circular and/or annular strip electrodes 451-1, 451-2 and 451-3. In the embodiment in FIGS. 13 to 17, the first electrode 451 includes a plurality of strip electrodes 451-1, 451-2 and 451-3 formed in concentric circles or rings, and each of the strip electrodes 451-1, 451-2 and 451-3 is electrically connected. A first strip electrode 451-1 having a circular shape is formed in the center, and second and third strip electrodes 451-2 and 451-3 having a ring shape with a gradually increasing diameter are arranged on the outside of the first strip electrode 451-1. The adhesive portion 460 may be applied to one surface of each strip electrode (or a surface in contact with each strip electrode) constituting the first electrode 451. The second electrode 452 has a single, non-separated shape.

An insulating layer 455 may be provided between each of the strip electrodes 451-1, 451-2 and 451-3 constituting the first electrode 451. In this case, unlike the embodiment in FIGS. 7 to 10, the detachable unit 435 includes a conductive wire connected to all of the strip electrodes 451-1, 451-2 and 451-3 constituting the first electrode 451, so that one control signal may be transmitted to each of the strip electrodes 451-1, 451-2 and 451-3.

Each of the strip electrodes 451-1, 451-2 and 451-3 constituting the first electrode 451 may have different thickness from each other. For example, the central strip electrode 451-1 among the strip electrodes constituting the first electrode 451 may be the thickest, and the variable portion 440-1 corresponding to the central strip electrode 451-1 may be the thinnest. With such a configuration, when an electric signal is applied, the first strip electrode 451-1 located in the center has the highest current density, and the corresponding first variable portion 44010 is the thinnest, and therefore, the first variable portion 44010 corresponding to the first strip electrode 451-1 located at the center expands and/or contract first compared to other variable portions 440-2 and 440-3 corresponding to the other strip electrodes 451-1 and 451-2.

Then, the outer annular second and third strip electrodes 451-1 and 451-3 and the second and third variable portions 440-2 and 440-3 corresponding thereto gradually expand and/or contract. As described above, when the dimension of the variable portions 440-1, 440-2 and 440-3 sequentially increase form the center to the outside, the LED 140 is separated from the adhesive portion 460 in the same direction, so that the LED 140 can be mounted in place without distortion and rotating. Accordingly, in accordance with the present embodiment, the precision of the LED transfer can be improved.

The LED transport device described above can transfer the LED selectively and the transfer precision of the LED can be improved compared to the conventional transport device. This may lead to an increase in productivity of the LED display device.

While the embodiments of the present disclosure have been described in detail with reference to the accompanying drawings, the present disclosure is not necessarily limited to those embodiments, and various modifications may be made within the scope of the present disclosure without departing from the technical spirit thereof. Accordingly, the embodiments disclosed in the specification are for explanation rather than limiting the technical spirit of the present disclosure, and the scope of the technical spirit of the present disclosure is not limited by those embodiments. Each feature of the various embodiment of the present disclosure may be partially or wholly linked or combined with each other, and may be variously interlocked and driven by those skill in the art, and each embodiment may be implemented independently each other or together in a related relationship. The scope of the present disclosure should be construed by the appended claims, and all technical ideas within the scope equivalent thereto should be construed as being included in the scope of the present disclosure.

The invention claimed is:

1. A light emitting diode transport device comprising:
a pickup unit configured to lift at least a part of a plurality of light emitting diodes disposed on a substrate and to put down a selected light emitting diode of the lifted part of the plurality of light emitting diodes on a second substrate by a received control signal; and
a controller configured to transmit the received control signal to the pickup unit so that the pickup unit individually lifts or puts down each of the plurality of light emitting diodes,
wherein the pickup unit includes a head including a plurality of detachable units configured to contact each of the plurality of light emitting diodes,
wherein each of the plurality of detachable units includes:
a first electrode;
a second electrode facing apart from the first electrode;
a variable portion disposed between the first electrode and the second electrode, the variable portion having a dimension changeable by an electric signal applied through the first electrode and the second electrode; and
an adhesive portion detachably attached to at least one of the plurality of light emitting diodes, and
wherein the first electrode includes a plurality of strip electrodes extended along a first direction and the second electrode includes a plurality of stripe electrodes extended along a second direction intersecting the first direction.

2. The light emitting diode transport device of claim 1, wherein the head includes a plate connected to a transport arm configured to move the head, and a stamp, wherein one surface of the stamp is configured to contact with the plate and another surface of the stamp is configured to contact with the plurality of light emitting diodes, and wherein the detachable unit is arranged protrudingly on the other surface of the stamp.

3. The light emitting diode transport device of claim 2, wherein the stamp comprises an elastomer.

4. The light emitting diode transport device of claim 1, wherein the first electrode includes a plurality of strip electrodes and the variable portion is arranged correspondingly to each of the plurality of strip electrodes.

5. The light emitting diode transport device of claim 4, wherein the variable portion is configured to expand or contract by a pre-determined order.

6. The light emitting diode transport device of claim 4, wherein the first electrode includes one or more strip electrodes corresponding to a concentric circle or a ring shape, and wherein the one or more strip electrodes are separated from each other, respectively.

7. The light emitting diode transport device of claim 6, wherein the detachable unit includes a conductive wire connected to each of the one or more strip electrodes.

8. The light emitting diode transport device of claim 1, wherein the variable portion is located at a position where any one of the plurality of strip electrodes extending along the first direction crosses any one of the plurality of strip electrodes extending along the second direction.

9. The light emitting diode transport device of claim 1, wherein the first electrode includes a plurality of stripe electrodes having a concentric circle or a ring shape, and wherein each of the plurality of strip electrodes is connected electrically to each other.

10. The light emitting diode transport device of claim 9, wherein each of the plurality of strip electrodes has a different thickness from each other.

11. The light emitting diode transport device of claim 10, wherein a central strip electrode among the plurality of strip electrodes is thickest amongst the plurality of strip electrodes.

12. The light emitting diode transport device of claim 11, wherein the plurality of strip electrodes is tapered from a center to a periphery.

13. The light emitting diode transport device of claim 12, wherein a variable portion disposed correspondingly to the central strip electrode expands or contracts before a variable portion corresponding to other strip electrode expands or contracts.

14. The light emitting diode transport device of claim 1, wherein the variable portion comprises an electrically active polymer.

15. The light emitting diode transport device of claim 1, wherein the variable portion comprises a polymer comprising at least one of polyvinylidene fluoride, poly(vinylidene fluoride-co-trifluroethylene), polydimethyl siloxane, an electrically active polymer and a liquid crystal elastomer.

16. The light emitting diode transport device of claim 1, wherein the adhesive portion comprises a polymer comprising at least one of polydimethyl siloxane and a polyamide acid.

17. The light emitting diode transport device of claim 1, wherein each of the plurality of detachable units has a different height from each other.

18. A light emitting diode transport device comprising:
- a pickup unit configured to lift at least a part of a plurality of light emitting diodes disposed on a substrate and to put down a selected light emitting diode of the lifted part of the plurality of light emitting diodes on a second substrate by a received control signal; and
- a controller configured to transmit the received control signal to the pickup unit so that the pickup unit individually lifts or puts down each of the plurality of light emitting diodes,
- wherein the pickup unit includes a head including a plurality of detachable units configured to contact each of the plurality of light emitting diodes,
- wherein each of the plurality of detachable units includes:
  - a first electrode;
  - a second electrode facing apart from the first electrode;
  - a variable portion disposed between the first electrode and the second electrode, the variable portion having a dimension changeable by an electric signal applied through the first electrode and the second electrode; and
  - an adhesive portion detachably attached to at least one of the plurality of light emitting diodes, and
- wherein the first electrode includes a plurality of stripe electrodes having a concentric circle or a ring shape, and wherein each of the plurality of stripe electrodes is connected electrically to each other.

19. The light emitting diode transport device of claim 18, wherein the first electrode includes a plurality of strip electrodes and the variable portion is arranged correspondingly to each of the plurality of strip electrodes.

20. The light emitting diode transport device of claim 19, wherein the variable portion is configured to expand or contract by a pre-determined order.

21. The light emitting diode transport device of claim 19, wherein the first electrode includes one or more strip electrodes corresponding to a concentric circle or a ring shape, and wherein the one or more strip electrodes are separated from each other, respectively.

* * * * *